United States Patent
Watanabe et al.

(10) Patent No.: US 7,879,528 B2
(45) Date of Patent: Feb. 1, 2011

(54) RESIST COMPOSITION FOR ELECTRON BEAM OR EUV

(75) Inventors: Takeo Watanabe, Hyogo-ken (JP); Hideo Hada, Kawasaki (JP); Hiroo Kinoshita, Hyogo-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 40 days.

(21) Appl. No.: 12/044,678

(22) Filed: Mar. 7, 2008

(65) Prior Publication Data

US 2008/0176170 A1    Jul. 24, 2008

Related U.S. Application Data

(63) Continuation of application No. 10/574,073, filed as application No. PCT/JP2004/015503 on Oct. 20, 2004, now Pat. No. 7,407,734.

(30) Foreign Application Priority Data

| Oct. 22, 2003 | (JP) | ............................. 2003-362223 |
| Oct. 30, 2003 | (JP) | ............................. 2003-371111 |
| Mar. 30, 2004 | (JP) | ............................. 2004-100206 |

(51) Int. Cl.
    G03F 7/00     (2006.01)
    G03F 7/004    (2006.01)
    G03F 7/20     (2006.01)
    G03F 7/26     (2006.01)
    G03F 7/40     (2006.01)

(52) U.S. Cl. .................... 430/270.1; 430/905; 430/330; 430/945; 430/942

(58) Field of Classification Search .............. 430/270.1, 430/311, 905
See application file for complete search history.

(56) References Cited

U.S. PATENT DOCUMENTS

| 5,238,775 | A | * | 8/1993 | Kajita et al. ................. 430/192 |
| 5,288,587 | A | * | 2/1994 | Osaki et al. .................. 430/191 |
| 5,456,995 | A | * | 10/1995 | Ozaki et al. ................. 430/191 |
| 5,702,862 | A | * | 12/1997 | Ohno et al. .................. 430/191 |
| 5,738,968 | A | * | 4/1998 | Hosoda et al. .............. 430/191 |
| 5,792,585 | A | * | 8/1998 | Ida et al. ...................... 430/191 |

(Continued)

FOREIGN PATENT DOCUMENTS

EP    0562819   A2    9/1993

(Continued)

OTHER PUBLICATIONS

Office Action issued on Oct. 21, 2008, on the counterpart Japanese Patent Application No. 2004-100206.

(Continued)

*Primary Examiner*—Amanda C. Walke
(74) *Attorney, Agent, or Firm*—Knobbe, Martens, Olson & Bear, LLP

(57) ABSTRACT

A resist composition and a method of forming a resist pattern that enable contamination within the exposure apparatus to be prevented in lithography processes using an electron beam or EUV (extreme ultraviolet light). In this method, an organic solvent containing, as the principal component, one or more compounds selected from a group consisting of propylene glycol monomethyl ether (PGME), methyl amyl ketone (MAK), butyl acetate (BuOAc), and 3-methyl methoxy propionate (MMP) is used as the resist solvent.

7 Claims, 1 Drawing Sheet

U.S. PATENT DOCUMENTS

| | | |
|---|---|---|
| 6,492,086 B1 | 12/2002 | Barclay et al. |
| 6,548,220 B2 | 4/2003 | Uetani et al. |
| 6,576,392 B1 | 6/2003 | Sato et al. |
| 6,767,688 B2 | 7/2004 | Teng et al. |
| 6,787,286 B2 | 9/2004 | Szmanda et al. |
| 6,849,374 B2 | 2/2005 | Cameron et al. |
| 6,855,485 B2 | 2/2005 | Irie |
| 6,927,009 B2 | 8/2005 | Kodama et al. |
| 6,966,710 B2 | 11/2005 | Irie et al. |
| 7,255,971 B2 | 8/2007 | Fujimori et al. |
| 2003/0017425 A1 | 1/2003 | Endo et al. |
| 2003/0077540 A1 | 4/2003 | Kodama et al. |
| 2003/0082486 A1 | 5/2003 | Endo et al. |
| 2003/0138727 A1 | 7/2003 | Kawabe et al. |
| 2003/0180659 A1 | 9/2003 | Takata et al. |
| 2003/0198894 A1 | 10/2003 | Mizutani et al. |
| 2004/0009429 A1 | 1/2004 | Sato |
| 2004/0029045 A1* | 2/2004 | Nunomura et al. ....... 430/283.1 |
| 2004/0053160 A1 | 3/2004 | Takahashi et al. |

FOREIGN PATENT DOCUMENTS

| | | |
|---|---|---|
| JP | H06-011836 | 1/1994 |
| JP | 09-281696 | 10/1997 |
| JP | 11-212265 | 8/1999 |
| JP | 2001-142212 | 5/2001 |
| JP | 2002-014470 | 1/2002 |
| JP | 2002-023375 | 1/2002 |
| JP | 2002-202606 | 7/2002 |
| JP | 2002-236364 | 8/2002 |
| JP | 2002-351077 | 12/2002 |
| JP | 2003-075998 | 3/2003 |
| JP | 2003-140361 | 5/2003 |
| JP | 2003-177537 | 6/2003 |
| JP | 2003-206315 | 7/2003 |
| JP | 2003-215806 | 7/2003 |
| JP | 2003-241384 | 8/2003 |
| JP | 2003-270790 | 9/2003 |
| JP | 2003-280202 | 10/2003 |
| JP | 2004-004557 | 1/2004 |
| JP | 2004-310004 | 11/2004 |

OTHER PUBLICATIONS

Office Action issued on counterpart Japanese Patent Application No. JP 2004-100206, dated Feb. 24, 2009.

* cited by examiner

RESIST COMPOSITION FOR ELECTRON BEAM OR EUV

RELATED APPLICATIONS

This application is a continuation of U.S. patent application Ser. No. 10/574,073, filed Mar. 30, 2006, which is the U.S. National Phase filing under 35 U.S.C. §371 of PCT/JP2004/015503, filed Oct. 20, 2004, which designated the United States and was published in a language other than English, which claims priority under 35 U.S.C. §119(a)-(d) to Japanese Patent Application No. 2003-362223, filed Oct. 22, 2003; Japanese Patent Application No. 2003-371111, filed Oct. 30, 2003; and Japanese Patent Application No. 2004-100206, filed Mar. 30, 2004. The content of these applications is incorporated herein by reference in their entireties.

TECHNICAL FIELD

The present invention relates to a resist composition and a method of forming a resist pattern for use with an electron beam or EUV (Extreme Ultraviolet, wavelength: approximately 13.5 nm) that is used to conduct exposure within a vacuum.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation such as g-line and i-line radiation has been used, but nowadays KrF excimer lasers (248 nm) are being used in mass production, and mass production using ArF (193 nm) is also starting to be introduced.

On the other hand, one example of a resist material that satisfies the high resolution conditions required to enable reproduction of a pattern of minute dimensions is a chemically amplified resist composition, which includes a base resin that undergoes a change in alkali solubility under the action of acid, and an acid generator that generates acid on exposure. Chemically amplified resist compositions include negative compositions, which contain an acid generator, a cross-linking agent, and an alkali-soluble resin that functions as a base resin, and positive compositions, which contain an acid generator and a resin that exhibits increased alkali solubility under the action of acid.

Moreover, recently, lithography processes using EUV and electron beams, which represent the next generation of technology following lithography processes using ArF excimer lasers (193 nm), have been proposed and researched (for example, see patent references 1, 2, and 3).

EUV exhibits a high degree of linearity, and the exposure apparatus is usually constructed using a reflective optical system using a mirror such as a multilayer mirror.

[Patent Reference 1]
Japanese Unexamined Patent Application, First Publication No. 2003-177537

[Patent Reference 2]
Japanese Unexamined Patent Application, First Publication No. 2003-140361

[Patent Reference 3]
Japanese Unexamined Patent Application, First Publication No. 2003-75998

DISCLOSURE OF INVENTION

Problems to be Solved by the Invention

However, a problem arises in processes using electron beams or EUV in that as exposure is continued, a phenomenon occurs wherein the exposure radiation reaching the substrate weakens, or stable exposure becomes impossible, or exposure itself becomes impossible.

On investigating this problem, the inventors of the present invention discovered that as repeated exposure is conducted, the mirror and mask become contaminated, leading to the problem described above.

The present invention aims to resolve the problem described above, with an object of providing a resist composition and a method of forming a resist pattern that enable contamination within the exposure apparatus to be prevented in lithography processes using an electron beam or EUV.

Means for Solving the Problems

In order to achieve the above object, the present invention includes the aspects described below. A first aspect is a resist composition for an electron beam or EUV, wherein an organic solvent containing as the principal component, one or more compounds selected from the group consisting of propylene glycol monomethyl ether (PGME), methyl amyl ketone (MAK), butyl acetate (BuOAc), and 3-methyl methoxy propionate (MMP) is used as the resist solvent.

A second aspect is a method of forming a resist pattern that includes the steps of applying a resist composition for an electron beam or EUV according to the aforementioned first aspect to a substrate, conducting a prebake, conducting selective exposure or direct patterning with an electron beam or EUV in a vacuum, performing PEB (post exposure baking), and then conducting alkali developing to form the resist pattern.

EFFECTS OF THE INVENTION

By application of the present invention, contamination within the exposure apparatus can be prevented for processes that use an electron beam or EUV.

BEST MODE FOR CARRYING OUT THE INVENTION

Resist Composition

First Aspect

Figure 1:
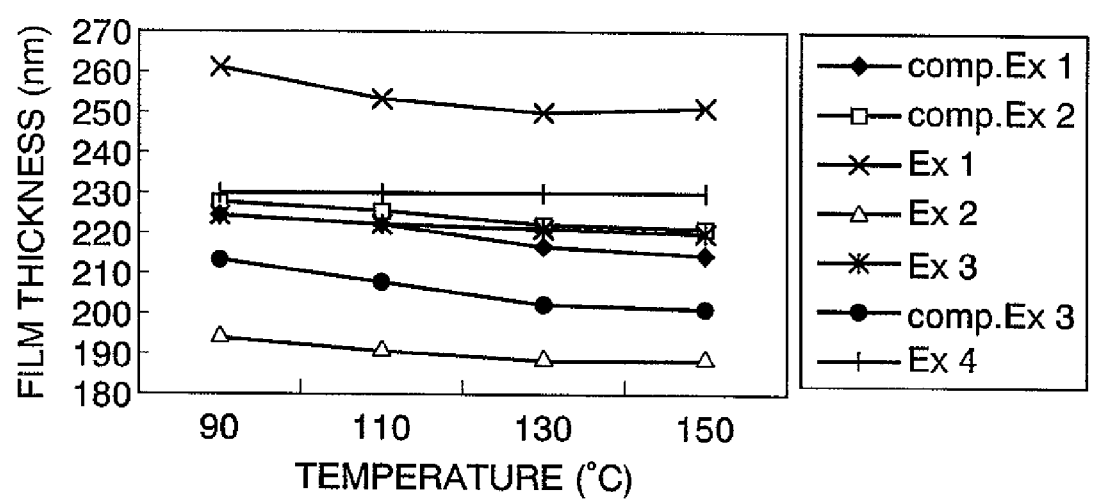
FIG. 1 is a graph showing the variation in film thickness relative to heating temperature for films obtained in the examples and comparative examples.

A resist composition of the present invention is a resist composition for an electron beam or EUV wherein an organic solvent containing, as the principal component, one or more compounds selected from the group consisting of propylene glycol monomethyl ether (PGME), methyl amyl ketone (MAK), butyl acetate (BuOAc), and 3-methyl methoxy propionate (MMP) is used as the resist solvent.

Using a resist solvent that contains this type of specific solvent as the principal component significantly reduces the occurrence of contaminants under the vacuum state conditions required for an exposure system for EUV or an electron beam. The reason for this finding is thought to be that these organic solvents tend to be readily volatilized under the heating conditions used during an EUV or electron beam exposure process. These organic solvents are also preferred from a safety perspective, and are ideal industrially.

In the first aspect, the object of the invention is achieved regardless of the nature of the other components added to the resist composition in addition to the resist solvent, including a compound (A) containing acid dissociable, dissolution inhibiting groups, and an acid generator (B), which are described below.

In contrast, if propylene glycol monomethyl ether acetate (PGMEA) and ethyl lactate (EL) are used, which until now have been the most widely used resist solvents, then contaminants are generated from within the resist film, and the object of the present invention cannot be achieved. The expression "an organic solvent containing, as the principal component" means that the one or more compounds selected from the group consisting of propylene glycol monomethyl ether (PGME), methyl amyl ketone (MAK), butyl acetate (BuOAc), and 3-methyl methoxy propionate (MMP) represent the main component of the solvent, and other optional solvents may also be added provided the effects of the present invention are retained.

Specifically, the proportion within the organic solvent of the one or more compounds selected from the group consisting of propylene glycol monomethyl ether (PGME), methyl amyl ketone (MAK), butyl acetate (BuOAc), and 3-methyl methoxy propionate (MMP) is typically at least 70% by weight, even more preferably 80% by weight or higher, and most preferably 90% by weight or higher.

There are no particular restrictions on the quantity of the organic solvent within the resist composition, and the quantity is usually selected so as to yield a concentration that enables favorable application of the composition to a substrate or the like, and is typically a quantity that produces a solid fraction concentration for the resist composition that falls within a range from 2 to 20% by weight, and preferably from 5 to 15% by weight.

Furthermore, in the first aspect, a resist composition that exhibits a first condition, wherein a formula (I) shown below is satisfied, is particularly desirable.

First Condition:

$$[\text{Film thickness (1)}-\text{Film thickness (2)}]/(150-130) (Å/°C.)=0.2(Å/°C.) \quad (I)$$

[In this formula, the film thickness (1) is the film thickness following application of the resist composition to a substrate in sufficient quantity to generate a film thickness of 2300 Å±10% and subsequent heating at 130° C. for 90 seconds, and the film thickness (2) is the film thickness following application of the resist composition to a substrate in sufficient quantity to generate a film thickness of 2300 Å±10% and subsequent heating at 150° C. for 90 seconds.]

If the above formula (I) is satisfied, then contamination within the exposure apparatus such as contamination of the mask or mirror can be prevented even in those cases where an electron beam or EUV is used, and as a result, stable exposure can be conducted. In other words, the problem that arises as exposure is continued, wherein a phenomenon occurs in which the exposure radiation reaching the substrate weakens, or stable exposure becomes impossible, or exposure itself becomes impossible, can be resolved.

The value represented by the formula (I) is the gradient of the variation in film thickness relative to the temperature, and smaller values for this gradient indicate a smaller degree of variation in the film thickness when heated within a range from 130 to 150° C. The value of the left-hand member of the above formula is typically no more than 0.2 (Å/° C.), preferably no more than 0.15 (Å/° C.), and even more preferably 0.1 (Å/° C.) or less. The smaller this value is the better, so there is no technical meaning in prescribing a lower limit value.

The reason for specifying heating at temperature conditions of 130° C. and 150° C. is due to consideration of the prebake temperature conditions used in electron beam or EUV lithography.

Setting the heating conditions to at least 130° C. facilitates the adjustments required to obtain favorable resist pattern characteristics such as contrast. Setting the temperature conditions to no more than 150° C. simply reflects the upper limit temperature in terms of the prebake operation and the heating apparatus used in the prebake.

The heating conditions in the method of forming a resist pattern described below are not restricted to the temperature range from 130 to 150° C., but setting the temperature within this range is preferred from the viewpoints of conducting stable exposure and obtaining a favorable resist pattern, and in terms of the apparatus and operation conditions.

It is surmised that by using a resist composition that satisfies the formula (I), the resist film adopts a stable state during prebake with respect to variations in environmental conditions such as the temperature or pressure or the like, and even when exposure (including selective exposure or direct patterning) is subsequently conducted using an electron beam or EUV, contaminants are not generated from the resist film, enabling contamination within the exposure apparatus to be prevented. As a result, stable exposure becomes possible.

The film thickness was set to a value of 2300 Å±10% based on the types of film thickness values used in processes that use an electron beam or EUV. The ±10% enables measurement error to be taken into consideration, and provided the value falls within this range, the value can be applied to the criterion determined by the formula (I).

Setting the heating time to 90 seconds was based on the prebake conditions used in typical lithography processes.

Furthermore, in the first aspect, a composition with characteristics that satisfy a second condition described below is even more desirable.

Second Condition:

The second condition requires that the degree of variation in the total pressure of the atmosphere inside the exposure system between the state prior to exposure and the state following exposure is less than $4.0 \times 10^{-5}$ Pa. As mentioned above, exposure using an electron beam or EUV is conducted within a vacuum, but on exposure, the generation of contaminants causes an increase in the pressure inside the exposure system. The degree of variation in the aforementioned total pressure is preferably no more than $3.5 \times 10^{-5}$ Pa, and even more preferably no more than $3.3 \times 10^{-5}$ Pa. The smaller this value is the better, so there is no technical meaning in prescribing a lower limit value. In the future, reducing this pressure variation to the $10^{-7}$ Pa or $10^{-8}$ Pa level is feasible, and this invention includes these types of ultra low pressure levels.

The total pressure refers to the pressure inside the chamber of the exposure apparatus system in which the substrate on which the resist film of the resist composition has been formed is placed, when the pressure is adjusted to vacuum conditions during exposure.

A small degree of variation in the total pressure over the period of exposure, as required by the second condition, means that materials within the resist composition are unlikely to be released into the atmosphere during exposure, that is, are resistant to gasification. As a result, by satisfying the second condition, contamination of the mirror or mask or the like by materials released into the atmosphere during exposure can be prevented.

The conditions for measuring the degree of variation in the total pressure are described below. These conditions represent the standard conditions for exposure in an apparatus that emits EUV or the like using current technology. In the future, there is a possibility of further improvements in the degree of vacuum. Currently, if the degree of variation satisfies the aforementioned numerical range under these conditions, then the object of the present invention can be satisfactorily achieved. Exposure conditions: temperature: room temperature (25° C.), NewSubaru radiation optical facility at the Himeji Institute of Technology, pressure: $1\times10^{-7}$ to $1\times10^{-5}$ Pa, and preferably $1\times10^{-6}$ Pa, heat accumulation current of the ring: 200 mA, exposure wavelength: 13.5 nm, exposure time: 60 seconds, resist film thickness: 100 nm.

The inside of the exposure system is designed so as to maintain the pressure at the above value, but as described above, when exposure is conducted, the pressure inside the exposure system increases as a result of contaminant generation. The "degree of variation in the total pressure of the atmosphere inside the exposure system between the state prior to exposure and the state following exposure" defined in the second condition can be determined by calculating the difference between the two values. In other words, the degree of variation can be determined by subtracting the pressure within the system immediately prior to exposure from the pressure in the system following exposure.

In the first aspect, a composition that satisfies both the first condition and the second condition is particularly preferred.

There are no particular restrictions on the other components within a resist composition of the present invention, but because a resist composition used in an electron beam or EUV process is typically a chemically amplified composition, the composition typically includes a compound (A) containing acid dissociable, dissolution inhibiting groups, and an acid generator (B).

As the component (A), either one, or a mixture of two or more compounds typically used for chemically amplified resists can be used.

As the component (A), polymer compounds such as the resin (A-1) described below, and lower molecular weight compounds (A-2) described below can be used.

Resin Component (A-1)

Either an alkali-soluble resin or a resin that can be converted to an alkali-soluble form can be used. The former represents a so-called negative resist composition, and the latter represents a so-called positive resist composition. A resist composition of the present invention is preferably a positive composition.

In the case of a negative composition, the resist composition also contains a cross-linking agent as well as the component (B). Then, during formation of the resist pattern, when acid is generated from the component (B) by exposure, the action of this acid causes cross-linking to occur between the component (A) and the cross-linking agent, thereby causing the component (A) to become insoluble in alkali. As the cross-linking agent, typically an amino-based cross-linking agent such as a melamine resin, urea, or glycoluril with methylol groups or alkoxylmethyl groups is used.

In the case of a positive composition, the component (A) is an alkali-insoluble resin that contains so-called acid dissociable, dissolution inhibiting groups, and when acid is generated from the component (B) upon exposure, this acid causes the acid dissociable, dissolution inhibiting groups to dissociate, making the component (A) alkali-soluble.

As the component (A-1), hydroxystyrene-based resins and resins containing structural units derived from a (meth)acrylate ester can be used, although regardless of whether the composition is a positive or negative composition, the resin preferably contains structural units derived from a (meth)acrylate ester.

In this description, the term "(meth)acrylic acid" is a generic term that includes both methacrylic acid and acrylic acid. Similarly, the term "(meth)acrylate" is a generic term that includes both methacrylate and acrylate. Furthermore, the term "structural unit" refers to a monomer unit that contributes to the formation of a polymer. The expression "structural unit derived from a (meth)acrylate ester" refers to a structural unit that is formed by the cleavage of the ethylenic double bond of the (meth)acrylate ester, and is hereafter also referred to as a (meth)acrylate structural unit.

Resin Component (A-1)

There are no particular restrictions on preferred resin components for the resin component (A-1), although the two resin types described below (both positive resins) are examples of preferred resins.

First Example Resin Component

The first example contains structural units (a1) through (a4) described below.

This resin undergoes an increase in alkali solubility under the action of acid. In other words, the action of the acid generated from the acid generator upon exposure causes cleavage within the structural units (a2) and (a3) described below, and this causes the resin, which was initially insoluble in an alkali developing solution, to undergo an increase in alkali solubility.

As a result, exposure and developing can be used to obtain a chemically amplified positive resist pattern.

Structural Unit (a1)

The structural unit (a1) is represented by a general formula (I) shown below.

[Formula 1]

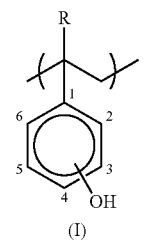

(I)

(wherein, R represents —H or —CH$_3$)

Provided R represents either —H or —CH$_3$, there are no particular restrictions.

There are no particular restrictions on the bonding position of the —OH group to the benzene ring, although the position labeled 4 in the formula (the para position) is preferred.

The quantity of the structural unit (a1) within the resin is preferably within a range from 40 to 80 mol %, and even more preferably from 50 to 75 mol %. By ensuring that this quantity is at least 40 mol %, the solubility of the resin in the alkali developing solution can be improved, and a favorable improvement in the resist pattern shape can also be obtained, whereas ensuring the quantity is no more than 80 mol % enables a favorable balance to be achieved with the other structural units.

Structural Unit (a2)

The structural unit (a2) is represented by a general formula (II) shown below.

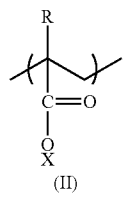

[Formula 2]

(II)

(wherein, R represents —H or —$CH_3$, and X represents an acid dissociable, dissolution inhibiting group)

Provided R represents either —H or —$CH_3$, there are no particular restrictions.

Examples of the acid dissociable, dissolution inhibiting group X include alkyl groups with a tertiary carbon atom in which the tertiary carbon atom is bonded to the ester group (—C(O)O—), as well as cyclic acetal groups such as a tetrahydropyranyl group and tetrahydrofuranyl group.

When acid is generated from the acid generator on exposure, the acid dissociable, dissolution inhibiting group dissociates from the unit (a2) under the action of the acid, thereby converting the structural unit (a2) to a (meth)acrylic acid structural unit [the term "(meth)acrylic acid structural unit is a generic term including a methacrylic acid structural unit and an acrylic acid structural unit], and as a result, improving the solubility of the resin in an alkali developing solution.

In addition to the groups described above, this type of acid dissociable, dissolution inhibiting group, namely the group X, can use any of the groups typically used within chemically amplified positive resist compositions.

Examples of preferred forms of the structural unit (a2) include the units represented by the general formula shown below in [formula 3].

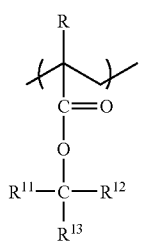

[Formula 3]

In this formula, R is as defined above, $R^{11}$, $R^{12}$ and $R^{13}$ each represent, independently, a lower alkyl group (which may be a straight-chain or branched group, and preferably contains from 1 to 5 carbon atoms). Furthermore, two of these groups may also be bonded together to form a monocyclic or polycyclic alicyclic group (in which the number of carbon atoms within the alicyclic group is preferably from 5 to 12).

In those cases where the structural unit does not include an alicyclic group, units in which $R^{11}$, $R^{12}$ and $R^{13}$ all represent methyl groups are preferred.

In those cases where the (a2) unit includes an alicyclic group, then in the case of a monocyclic alicyclic group, (a2) units containing a cyclopentyl group or cyclohexyl group or the like are preferred.

Furthermore, in the case of a polycyclic alicyclic group, examples of preferred units include those represented by general formulas shown below in [formula 4] and [formula 5].

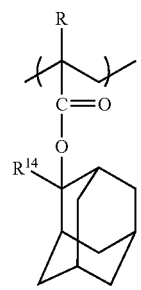

[Formula 4]

[wherein, R is as defined above, and $R^{14}$ represents a lower alkyl group (which may be a straight-chain or branched group, and preferably contains from 1 to 5 carbon atoms)]

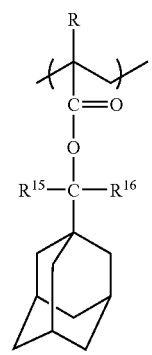

[Formula 5]

[wherein, R is as defined above, and $R^{15}$ and $R^{16}$ each represent, independently, a lower alkyl group (which may be a straight-chain or branched group, and preferably contains from 1 to 5 carbon atoms)]

The quantity of the structural unit (a2) within the resin is typically within a range from 5 to 30 mol %, and preferably from 10 to 20 mol %. By ensuring this quantity is at least 5 mol %, an increased level of alkali solubility can be obtained following dissociation, and a favorable improvement in the resist pattern shape can also be obtained, whereas ensuring the quantity is no more than 30 mol % enables a favorable balance to be achieved with the other structural units, and also enables easier control of the solubility of the resin in an alkali developing solution.

Structural Unit (a3)

The structural unit (a3) is represented by a general formula (III) shown below.

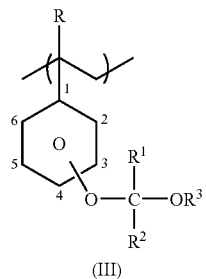

[Formula 6]

(III)

(wherein, R and $R^1$ each represent, independently, —H or —$CH_3$, $R^2$ represents —$CH_3$ or —$C_2H_5$, and $R^3$ represents a lower alkyl group)

The lower alkyl group $R^3$ may be either a straight chain or a branched chain, and preferably contains from 1 to 5 carbon atoms.

There are no particular restrictions on the bonding position of the group bonded to the benzene ring, although the position labeled 4 in the formula (the para position) is preferred.

Suitable examples of the group bonded to the benzene ring include a 1-methoxyethoxy group, 1-ethoxyethoxy group, 1-n-propoxyethoxy group, 1-isopropoxyethoxy group, 1-n-butoxyethoxy group, 1-isobutoxyethoxy group, 1-(1,1-dimethylethoxy)-1-methylethoxy group, 1-methoxy-1-methylethoxy group, 1-ethoxy-1-methylethoxy group, 1-n-propoxy-1-methylethoxy group, 1-isobutoxy-1-methylethoxy group, 1-methoxy-n-propoxy group, and 1-ethoxy-n-propoxy group.

Of these, a 1-ethoxyethoxy group and a 1-methoxy-n-propoxy group are preferred, and a 1-ethoxyethoxy group is the most desirable.

The quantity of the structural unit (a3) within the resin is preferably within a range from 10 to 50 mol %, and even more preferably from 20 to 40 mol %. By ensuring this quantity is at least 10 mol %, an increased level of alkali solubility can be obtained following dissociation, and a favorable resist pattern shape can also be obtained, whereas ensuring the quantity is no more than 50 mol % enables a favorable balance to be achieved with the other structural units.

Structural Unit (a4)

The structural unit (a4) is represented by a general formula (IV) shown below.

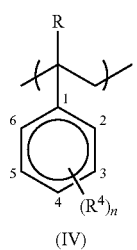

[Formula 7]

(IV)

(wherein, R represents —H or —$CH_3$, $R^4$ represents a lower alkyl group, and n represents either 0 or an integer from 1 to 3)

The lower alkyl group $R^4$ may be either a straight chain or a branched chain, and preferably contains from 1 to 5 carbon atoms.

n is either 0 or an integer from 1 to 3, but is preferably 0.

The quantity of the structural unit (a4) within the resin component is preferably within a range from 1 to 35 mol %, and even more preferably from 5 to 20 mol %. By ensuring this quantity is at least 1 mol %, the level of improvement in the shape (and particularly the improvement in thickness loss described below) is enhanced, whereas ensuring the quantity is no more than 35 mol % enables a favorable balance to be achieved with the other structural units.

The resin may use either a copolymer that contains all of the aforementioned structural units (a1), (a2), (a3) and (a4), or a mixture of polymers that each contain one or more of these units. A combination of these two options is also possible.

Furthermore, the resin component (A-1) may also contain other optional units in addition to the above structural units (a1), (a2), (a3) and (a4), although the proportion of the resin component accounted for by these four structural units is preferably at least 80 mol %, and even more preferably 90 mol % or more, and is most preferably 100 mol %.

Furthermore, in the positive resist composition resin, the use of a copolymer (1) that contains the aforementioned structural units (a1) and (a3), or a copolymer (2) that contains the aforementioned structural units (a1), (a2) and (a4), or the use of a mixture of these two copolymers readily produces the desired effects, and is consequently the most preferred configuration for the resin. This configuration is also preferred in terms of improving the heat resistance.

In the case where the copolymers are mixed, the weight ratio between the copolymer (1) and the copolymer (2) is typically within a range from 1/9 to 9/1, and is preferably from 3/7 to 7/3.

The polystyrene equivalent weight average molecular weight of the resin, determined using GPC, is preferably within a range from 3,000 to 30,000, and even more preferably from 5,000 to 20,000.

The resin can be obtained by polymerization of the monomers for the aforementioned structural units using known methods.

Second Example Resin Component

The resin of the second example is a resin component that contains polycyclic group-containing acid dissociable, dissolution inhibiting groups at ester side chain sections, contains structural units derived from a (meth)acrylate ester within the principal chain, and exhibits increased alkali solubility under the action of acid.

In this resin, the action of the acid generated from the aforementioned component (B) on exposure causes the aforementioned polycyclic group-containing acid dissociable, dissolution inhibiting groups, which exhibit excellent etching resistance, to dissociate, thereby converting the entire resin component from an alkali-insoluble state to an alkali-soluble state. As a result, by conducting exposure through a mask pattern during formation of a resist pattern, the alkali solubility of the exposed portions can be increased, enabling alkali developing to be conducted.

Furthermore, this resin component may include, for example, a combination of monomer units that exhibit a plurality of different functions, although the aforementioned methacrylate ester structural units or acrylate ester structural units may also be included within any of the monomer units used in forming the resin component.

For example, the resin component preferably includes:

a structural unit which contains a polycyclic group-containing acid dissociable, dissolution inhibiting group, and is derived from a (meth)acrylate ester (hereafter also referred to as the first structural unit), a structural unit which contains a lactone-containing monocyclic or polycyclic group, and is derived from a (meth)acrylate ester (hereafter also referred to as the second structural unit), and a structural unit which contains a hydroxyl group-containing polycyclic group, and is derived from a (meth)acrylate ester (hereafter also referred to as the third structural unit).

In such cases, the first structural unit is essential, and although resins containing two types of structural units, namely the first structural unit and either the second structural unit or third structural unit are suitable, resin components containing all of the first through third structural units are preferred in terms of factors such as etching resistance, resolution, and the adhesion between the resist film and the substrate.

In addition, if the resin component also includes the following structural unit (hereafter also referred to as the fourth structural unit or the structural unit (a14)), then the composition exhibits superior resolution for isolated patterns through to semi-dense patterns (line and space patterns in which for a line width of 1, the space width is from 1.2 to 2), which is preferred.

a structural unit which contains a polycyclic group that is different from the polycyclic group-containing acid dissociable, dissolution inhibiting group of the first structural unit, the lactone-containing monocyclic or polycyclic group of the second structural unit, and the hydroxyl group-containing polycyclic group of the third structural unit, and is derived from a (meth)acrylate ester.

Accordingly, the combination of the first through fourth structural units can be adjusted appropriately in accordance with factors such as the desired characteristics.

The resin component preferably includes either one, or both of a structural unit (a11) which contains a polycyclic group-containing acid dissociable, dissolution inhibiting group, and is derived from an acrylate ester, and a structural unit (a11') which contains a polycyclic group-containing acid dissociable, dissolution inhibiting group, and is derived from a methacrylate ester.

In a preferred resin component, by including both the aforementioned structural unit (a11) and the aforementioned structural unit (a11') as structural units which contain a polycyclic group-containing acid dissociable, dissolution inhibiting group, and are derived from a (meth)acrylate ester, a resolution improvement effect can be obtained.

If both structural units are included, then the molar ratio structural units (a11):structural units (a11') is preferably 0.4 to 2.5, and even more preferably 0.6 to 1.5, as such ratios yield superior compatibility between the polymer containing the structural units (a11) and the polymer containing the structural units (a11').

Furthermore, the resin component preferably includes either one, or both of a structural unit (a12) which contains a lactone-containing monocyclic or polycyclic group, and is derived from an acrylate ester, and a structural unit (a12') which contains a lactone-containing monocyclic or polycyclic group, and is derived from a methacrylate ester.

In a preferred resin component, the structural unit which contains a lactone-containing monocyclic or polycyclic group, and is derived from a (meth)acrylate ester preferably includes both the aforementioned structural unit (a12) and the aforementioned structural unit (a12').

If both structural units are included, then the molar ratio structural units (a12) structural units (a12') is preferably within a range from 0.2 to 5.0, and even more preferably 0.6 to 1.5, as such ratios yield superior compatibility between the polymer containing the structural units (a12) and the polymer containing the structural units (a12').

In addition, the resin component preferably includes either one, or both of a structural unit (a13) which contains a hydroxyl group-containing polycyclic group, and is derived from an acrylate ester, and a structural unit (a13') which contains a hydroxyl group-containing polycyclic group, and is derived from a methacrylate ester.

In a preferred resin component, the structural unit which contains a hydroxyl group-containing polycyclic group, and is derived from a (meth)acrylate ester preferably includes both the aforementioned structural unit (a13) and the aforementioned structural unit (a13').

If both structural units are included, then the molar ratio structural units (a13) structural units (a13') is preferably within a range from 0.2 to 5.0, and even more preferably 0.6 to 1.5, as such ratios yield superior compatibility between the polymer containing the structural units (a13) and the polymer containing the structural units (a13').

Furthermore, amongst the three sets of structural units, namely the set of the structural units (a11) and (a11'), the set of the structural units (a12) and (a12'), and the set of the structural units (a13) and (a13'), the resin preferably includes at least two of these sets, and most preferably includes all three sets.

In the structural units (a11) and (a11'), examples of the polycyclic group include groups in which one hydrogen atom has been removed from a bicycloalkane, tricycloalkane or tetracycloalkane or the like.

Specific examples include groups in which one hydrogen atom has been removed from a polycycloalkane such as adamantane, norbornane, isobornane, tricyclodecane or tetracyclododecane.

These types of polycyclic groups can be appropriately selected from the multitude of groups proposed for resins for use within ArF resists.

Of these groups, an adamantyl group, norbornyl group, or tetracyclododecanyl group is preferred from an industrial viewpoint.

Furthermore, the acid dissociable, dissolution inhibiting group can use any group, without any particular restrictions, which exhibits an alkali dissolution inhibiting effect that renders the entire resin component alkali-insoluble prior to exposure, but then dissociates under the action of acid generated from the acid generator (B) following exposure, causing the entire resin component to become alkali-soluble.

Typically, groups that form a cyclic or chain-like tertiary alkyl ester with the carboxyl group of the (meth)acrylic acid are the most widely known.

There are no particular restrictions on the structural units (a11) and (a11'), provided they exhibit this type of action, although in either one or both (and preferably in both) of the structural units (a11) and (a11'), the polycyclic group-containing acid dissociable, dissolution inhibiting group is preferably selected from the general formulas (I-B), (II-B), and (III-B) shown below, as such groups yield superior levels of resolution and dry etching resistance.

(I-B)

[Formula 8]

(wherein, $R^{1'}$ represents a lower alkyl group)

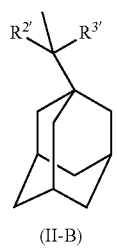

(II-B)

[Formula 9]

(wherein, $R^{2'}$ and $R^{3'}$ each represent, independently, a lower alkyl group)

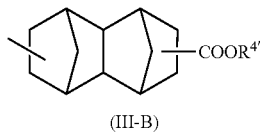

(III-B)

[Formula 10]

(wherein $R^{4'}$ represents a tertiary alkyl group)

Specifically, either one or both (and preferably both) of the structural units (a11) and (a11') are preferably one or more units selected from the general formulas (I'), (II'), and (III') shown below.

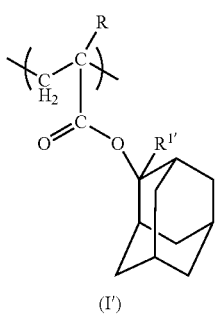

(I')

[Formula 11]

(wherein, R represents a hydrogen atom or a methyl group, and $R^{1'}$ represents a lower alkyl group, so that when R is a hydrogen atom, the unit becomes the structural unit (a11), and when R is a methyl group, the unit becomes the structural unit (a11'))

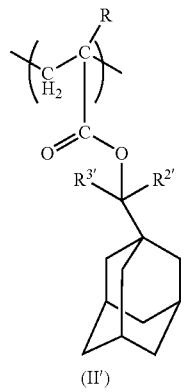

(II')

[Formula 12]

(wherein, R represents a hydrogen atom or a methyl group, and $R^{2'}$ and $R^{3'}$ each represent, independently, a lower alkyl group, so that when R is a hydrogen atom, the unit becomes the structural unit (a11), and when R is a methyl group, the unit becomes the structural unit (a11'))

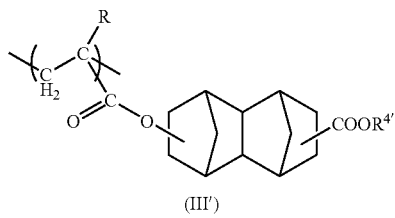

(III')

[Formula 13]

(wherein, R represents a hydrogen atom or a methyl group, and $R^{4'}$ represents a tertiary alkyl group, so that when R is a hydrogen atom, the unit becomes the structural unit (a11), and when R is a methyl group, the unit becomes the structural unit (a11'))

The structural unit represented by the above general formula (I') represents the case wherein the carbon atom that is adjacent to the oxygen atom (—O—) of the ester function of the (meth)acrylate unit is a tertiary alkyl group that exists within the ring skeleton of an adamantyl group or the like.

Furthermore, in the aforementioned general formulas (I-B) and (I'), R is a hydrogen atom or a methyl group.

Furthermore, the group $R^{1'}$ is preferably a straight-chain or branched lower alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. Of these, an alkyl group of at least 2 carbon atoms, and preferably from 2 to 5 carbon atoms is preferred, and in such cases, the acid dissociability tends to increase compared with the case in which $R^{1'}$ is a methyl group. From an industrial viewpoint, a methyl group or ethyl group is preferred.

The structural unit represented by the above general formula (II') represents the case wherein the carbon atom that is adjacent to the oxygen atom (—O—) of the ester function of the (meth)acrylate unit is a tertiary alkyl group, and a ring skeleton such as an adamantyl group exists within this tertiary alkyl group.

In the aforementioned general formulas (II-B) and (II'), R is as defined above for the general formulas (I-B) and (I').

The groups $R^{2'}$ and $R^{3'}$ each preferably represent, independently, a lower alkyl group of 1 to 5 carbon atoms. These types of groups tend to exhibit a higher acid dissociability than a 2-methyl-2-adamantyl group.

Specifically, the groups $R^{2'}$ and $R^{3'}$ each represent, independently, the same types of straight chain or branched lower alkyl groups as those described above for $R^{1'}$. Of these groups, the case in which $R^{2'}$ and $R^{3'}$ are both methyl groups is preferred industrially.

The structural unit represented by the above general formula (III') represents the case wherein the carbon atom that is adjacent to the oxygen atom (—O—) of a separate ester from the ester function of the (meth)acrylate unit is a tertiary alkyl group, and the (meth)acrylate ester and this separate ester are connected via a ring skeleton such as a tetracyclododecanyl group.

In the aforementioned general formulas (III-B) and (III'), R is as defined above for the general formulas (I') and (II').

Furthermore, the group $R^{4'}$ represents a tertiary alkyl group such as a tert-butyl group or tert-amyl group, although the case in which $R^{4'}$ is a tertiary alkyl group of either 4 or 5 carbon atoms is preferred, and a tert-butyl group is preferred industrially.

Of the units described above, the use of either a unit represented by one of the general formulas (I') or (II'), or units represented by both general formulas (and preferably units of both formulas) is preferred, and moreover, the case in which $R^{1'}$ is a methyl group or an ethyl group, and $R^{2'}$ and $R^{3'}$ are both methyl groups provides superior resolution, and is consequently preferred.

In the aforementioned structural units (a12) and (a12'), the lactone functional group is effective in improving the adhesion between the resist film and the substrate, and increasing the hydrophilicity relative to the developing solution.

There are no particular restrictions on the structural units (a12) and (a12'), provided they include both this type of lactone functional group and a monocyclic or polycyclic group.

Examples of lactone-containing monocyclic groups include groups in which one hydrogen atom has been removed from γ-butyrolactone.

Furthermore, examples of lactone-containing polycyclic groups include groups in which one hydrogen atom has been removed from lactone-containing bicycloalkanes of the structural formulas shown below.

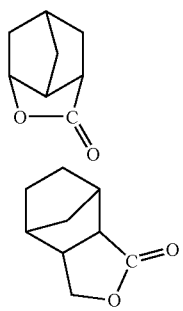

[Formula 14]

Furthermore, in either one or both (and preferably in both) of the structural units (a12) and (a12'), the aforementioned lactone-containing monocyclic or polycyclic group is preferably one or more units groups from the general formulas (IV-B) and (V-B) shown below.

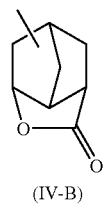

(IV-B)

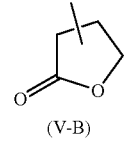

(V-B)

[Formula 15]

As the structural units (a12) and (a12'), more specific examples include structural units derived from a (meth)acrylate ester containing a lactone-containing monocycloalkyl group or bicycloalkyl group, as represented by the structural formulas shown below.

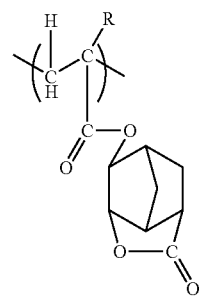

[Formula 16]

(wherein, R is as defined above)

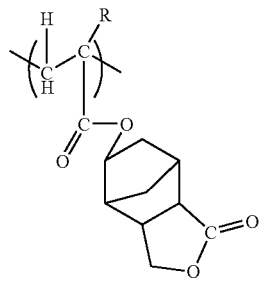

[Formula 17]

(wherein, R is as defined above)

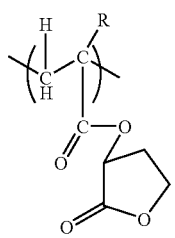

[Formula 18]

(wherein, R is as defined above)

Of these units, γ-butyrolactone esters of (meth)acrylic acid with an ester linkage at the α carbon atom or norbornane lactone esters are particularly preferred in terms of industrial availability.

Because the hydroxyl group of the structural units (a13) and (a13') is a polar group, using these structural units results in an enhanced affinity for the entire resin component relative to the developing solution, and an improvement in the alkali solubility of the exposed sections of the resist. Accordingly, the structural units (a13) and (a13') contribute to an improvement in the resolution.

In the structural units (a13) and (a13'), as the polycyclic group, a group can be selected appropriately from the same plurality of polycyclic groups listed in the description of the aforementioned structural units (a11) and (a11').

In the structural units (a13) and (a13') there are no particular restrictions on the polycyclic group provided it is a hydroxyl group-containing polycyclic group, although groups such as a hydroxyl group-containing adamantyl group are particularly desirable.

In addition, using a hydroxyl group-containing adamantyl group represented by a general formula (VI-B) shown below increases the dry etching resistance and improves the verticalness of the pattern cross-sectional shape, and is consequently preferred.

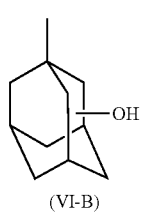

[Formula 19]

(VI-B)

Specifically, either one or both (and preferably both) of the structural units (a13) and (a13') are preferably structural units represented by a general formula (VI') shown below.

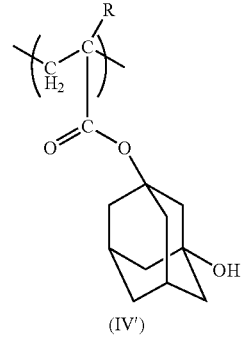

[Formula 20]

(IV')

(wherein, R is as defined above)

If the combination of the structural unit (a11) and the structural unit (a11') accounts for 30 to 60 mol %, and preferably from 30 to 50 mot %, of the combined total of all the structural units that constitute the aforementioned resin component, then the resolution is superior, which is preferred.

Furthermore, if the combination of the structural unit (a12) and the structural unit (a12') accounts for 20 to 60 mol %, and preferably from 20 to 50 mol %, of the combined total of all the structural units that constitute the aforementioned resin component, then the resolution is superior, which is preferred.

Furthermore, if the combination of the structural unit (a13) and the structural unit (a13') accounts for 1 to 50 mol %, and preferably from 20 to 40 mol %, of the combined total of all the structural units that constitute the aforementioned resin component, then the resist pattern shape is superior, which is preferred.

In addition, as this type of copolymer (11), a copolymer (i) described below offers excellent resolution, and is consequently preferred.

Copolymer (i): a copolymer that contains the structural unit (a11'), the structural unit (a12'), and the structural unit (a13).

In this copolymer (i), from the viewpoints of achieving favorable resolution and resist pattern shape, the structural unit (a11') preferably accounts for 30 to 60 mol %, and even more preferably from 30 to 50 mol %, the structural unit (a12') preferably accounts for 20 to 60 mol %, and even more preferably from 20 to 50 mol %, and the structural unit (a13) preferably accounts for 1 to 50 mol %, and even more preferably from 20 to 40 mol %, of the combination of these structural units (a11'), (a12'), and (a13).

As a mixed resin (12), a mixed resin containing a copolymer (ii) described below and a copolymer (iii) described below enables a balanced improvement in the etching resistance (the surface roughness) and the resolution, and is consequently preferred.

Copolymer (ii): a copolymer that contains from 30 to 60 mol % of the structural unit (a11), from 20 to 60 mol % of the structural unit (a12), and from 1 to 50 mold %, and preferably from 5 to 40 mol %, of the structural unit (a13).

Copolymer (iii): a copolymer that contains from 30 to 60 mol % of the structural unit (a11'), from 20 to 60 mol % of the structural unit (a12'), and from 1 to 50 mol %, and preferably from 5 to 40 mol %, of the structural unit (a13').

Furthermore, in this mixed resin, the weight ratio between the copolymer (ii) and the copolymer (iii) is preferably within a range from 80:20 to 20:80.

Moreover, in the copolymers (ii) and (iii), the inclusion of the structural unit (a 13) or the structural unit (a13') respectively is optional.

However, if either one or both (and preferably both) of the structural unit (a13) and the structural unit (a13') are included, then because the hydroxyl group is a polar group, as described above, the entire resin component exhibits enhanced affinity relative to the developing solution, and the alkali solubility of the exposed portions improves, contributing to a favorable improvement in the resolution.

Furthermore, as the mixed resin (12), a mixed resin of the aforementioned copolymer (i) and the copolymer (ii) also enables a balanced improvement in both the etching resistance (the surface roughness) and the resolution, and is consequently preferred.

Furthermore, in this mixed resin, the weight ratio between the copolymer (i) and the copolymer (ii) is preferably within a range from 80:20 to 20:80.

In the copolymer (ii), as described above, the inclusion of the structural unit (13) is optional, although including the structural unit (13) contributes to an improvement in the resolution, and is consequently preferred.

Furthermore, as the aforementioned copolymer (11), a copolymer (iv) described below also exhibits excellent resolution and minimal surface roughness during etching, and is composition preferred.

Copolymer (iv): a copolymer that contains from 30 to 60 mol %, and preferably from 30 to 50 mol % of the structural unit (a11'), from 20 to 60 mol %, and preferably from 20 to 50 mol % of the structural unit (a12), and from 1 to 50 mol %, and preferably from 20 to 40 mol %, of the structural unit (a13).

Furthermore, as described above, the resin component preferably also includes, as the aforementioned fourth structural unit, a structural unit [the structural unit (a14)] which contains a polycyclic group that is "different from the aforementioned polycyclic group-containing acid dissociable, dissolution inhibiting group, the aforementioned lactone-containing monocyclic or polycyclic group, and the aforementioned hydroxyl group-containing polycyclic group", and is derived from a (meth)acrylate ester.

The expression "different from the aforementioned polycyclic group-containing acid dissociable, dissolution inhibiting group, the aforementioned lactone-containing monocyclic or polycyclic group, and the aforementioned hydroxyl group-containing polycyclic group" means that the polycyclic group of the structural unit (a14) does not duplicate the polycyclic group-containing acid dissociable, dissolution inhibiting group of the first structural unit, the lactone-containing monocyclic or polycyclic group of the second structural unit, or the hydroxyl group-containing polycyclic group of the third structural unit, meaning, in other words, that the structural unit (a14) contains no polycyclic group-containing acid dissociable, dissolution inhibiting groups of the first structural unit, no lactone-containing, monocyclic or polycyclic groups of the second structural unit, and no hydroxyl group-containing polycyclic groups of the third structural unit.

There are no particular restrictions on this polycyclic group, provided it is selected so as not to duplicate any of the first through third structural units within a single resin component. For example, the same polycyclic groups as those described in relation to the aforementioned structural units (a11) and (a11') can be used, and any of the multitude of materials conventionally used for ArF positive resist materials can be used.

From the viewpoint of industrial availability, one or more groups selected from amongst a tricyclodecanyl group, adamantyl group, and tetracyclododecanyl group is preferred.

Within a single resin component, the structural unit (a14) may include either one, or both of a unit derived from an acrylate ester and a unit derived from a methacrylate ester.

Specifically, the structural unit (a14) may be used as a unit for forming the aforementioned copolymer (11), or as one or more of the structural units for one or more of the resins used for forming the mixed resin (12), although from the viewpoint of the effects achieved, the structural unit (a14) is preferably used together with the aforementioned first through third structural units, as one unit within a copolymer.

Examples of the structural unit (a14) are shown below in [formula 21] through [formula 23].

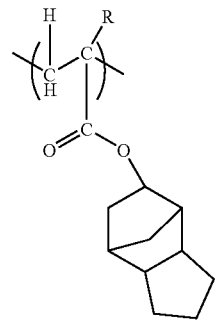

[Formula 21]

(wherein, R represents a hydrogen atom or a methyl group)

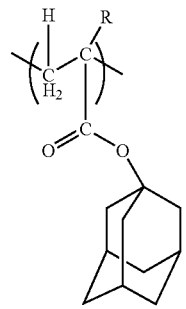

[Formula 22]

(wherein, R represents a hydrogen atom or a methyl group)

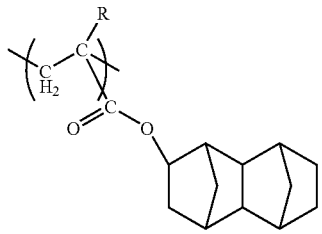

[Formula 23]

(wherein, R represents a hydrogen atom or a methyl group)

If the structural unit (a14) typically accounts for 1 to 25 mol %, and preferably from 10 to 20 mol %, of the combined total of all the structural units that constitute the aforementioned resin component, then the resolution for isolated patterns through to semi-dense patterns is superior, which is preferred.

Furthermore, in those cases where the structural unit (a14) is included, if the aforementioned copolymer (11) is a copolymer (v) described below, then in addition to the effects of the aforementioned (a4) units, the surface roughness during etching and the line edge roughness can also be improved favorably.

Copolymer (v): a copolymer that contains the structural unit (a11'), the structural unit (a12), the structural unit (a13), and the structural unit (a14).

Furthermore, in this copolymer (v), from the viewpoint of achieving favorable resolution and resist pattern shape, the structural unit (a11') typically accounts for 30 to 60 mol %, and preferably from 30 to 50 mol %, the structural unit (a12) typically accounts for 20 to 60 mol %, and preferably from 20 to 50 mol %, the structural unit (a 13) typically accounts for 1 to 30 mol %, and preferably from 10 to 20 mol %, and the structural unit (a14) typically accounts for 1 to 25 mol %, and preferably from 10 to 20 mol % of the combination of these structural units (a11'), (a12), (a13), and (a14).

Furthermore, if the aforementioned mixed resin (12) is a mixed resin of the aforementioned copolymer (iv) and the copolymer (v), then the resolution of an isolated space pattern (trench) can be improved favorably.

In this mixed resin, the weight ratio between the copolymer (iv) and the copolymer (v) is preferably within a range from 80:20 to 20:80.

Moreover, in the copolymers (iv) and (v), the inclusion of the structural unit (a13) or the structural unit (a13') respectively is optional.

However, if either one or both (and preferably both) of the structural unit (a13) and the structural unit (a13') are included, then because the hydroxyl group is a polar group, as described above, the entire resin component exhibits enhanced affinity relative to the developing solution, and the alkali solubility of the exposed portions improves, contributing to a favorable improvement in the resolution.

Although there are no particular restrictions on the weight average molecular weight of the copolymer that constitutes the resin component, or the polymers that constitute the mixed resin, the value is preferably within a range from 5,000 to 30,000, and even more preferably from 8,000 to 20,000. If the weight average molecular weight is larger than this range, then there is a danger that the solubility of the component within the resist solvent deteriorates, whereas if the value is smaller than the above range, there is a danger of a deterioration in the cross-sectional shape of the resist pattern.

The copolymer or the polymers that constitute the mixed resin can be produced easily by conventional radical polymerization or the like of the corresponding (meth)acrylate ester monomers and the like, using a radical polymerization initiator such as azobisisobutyronitrile (AIBN).

Low Molecular Weight Compound (A-2)

There are no particular restrictions on the low molecular weight compound (A-2), provided it is of low molecular weight, and contains the type of acid dissociable, dissolution inhibiting group described above in relation to (A-1). Examples of the low molecular weight compound typically include compounds with a molecular weight of no more than 2,000, wherein a portion of the hydrogen atoms of hydroxyl groups within a compound containing a plurality of phenol structures have been substituted with an aforementioned acid dissociable, dissolution inhibiting group. Examples of such compounds include compounds wherein a portion of the hydrogen atoms of the hydroxyl groups within the low molecular weight phenol compounds known as sensitizers or heat resistance improvement agents within non-chemically amplified g-line and i-line resists have been substituted with an acid dissociable, dissolution inhibiting group, and any of these compounds can be used.

Examples of these low molecular weight phenol compounds include the compounds listed below.

Namely, examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl) methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course, the present invention is nor limited to these compounds.

There are no particular restrictions on the acid dissociable, dissolution inhibiting group, and suitable examples include the groups described above.

Acid Generator (B)

As the component (B), any of the compounds known as conventional acid generators for use within chemically amplified resists can be appropriately selected and used.

Specific examples of suitable diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoro methanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Of these compounds, onium salts containing a fluorinated alkylsulfonate ion as the anion are preferred.

Examples of suitable oxime sulfonate compounds include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfolnyloxyimino)-p-bromophenylacetonitrile. Of these, α-(methylsulfonyloxyimino)-p-methoxyphenylacetonitrile is preferred.

As the component (B), either a single acid generator may be used alone, or a combination of two or more different acid generators may be used.

The quantity used of the component (B) is typically within a range from 1 to 20 parts by weight, and preferably from 2 to 10 parts by weight, per 100 parts by weight of the component (A). If this quantity is less than the above range, then pattern formation may not progress satisfactorily, whereas if the quantity exceeds the above range, it becomes difficult to achieve a uniform solution, and there is also a danger of a deterioration in the storage stability of the composition.

In order to improve the resist pattern shape and the post exposure stability of the latent image formed by the pattern-wise exposure of the resist layer, a nitrogen-containing organic compound can also be added to the resist composition as an optional component (C).

A multitude of these nitrogen-containing organic compounds have already been proposed, and one of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, and triethanolamine, and of these, tertiary alkanolamines such as triethanolamine are particularly preferred.

These may be used either alone, or in combinations of two or more different compounds.

These compounds are typically used in a quantity within a range from 0.01 to 5.0 parts by weight per 100 parts by weight of the component (A).

Furthermore, in order to prevent any deterioration in sensitivity caused by the addition of the aforementioned component (C), and improve the resist pattern shape and the post exposure stability of the latent image formed by the pattern-wise exposure of the resist layer, an organic carboxylic acid, or a phosphorus oxo acid or derivative thereof can also be added as an optional component (D). The component (C) and the component (D) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (D) is typically used in a quantity within a range from 0.01 to 5.0 parts by weight per 100 parts by weight of the component (A).

Other miscible additives can also be added to a resist composition of the present invention according to need, and examples include additive resins for improving the properties of the resist film, surfactants for improving the ease of application, dissolution inhibitors, plasticizers, stabilizers, colorants, and halation prevention agents.

[Method of Forming Resist Pattern]

A method of forming a resist pattern according to the present invention can be conducted, for example, in the manner described below.

Namely, an aforementioned positive resist composition is first applied to the surface of a substrate such as a silicon wafer using a spinner or the like, a prebake is conducted under temperature conditions of 80 to 150° C., and preferably from 130 to 150° C., for a period of 40 to 120 seconds, and preferably for 60 to 90 seconds, the thus obtained film is then subjected to selective exposure in a vacuum (for example, $1 \times 10^{-7}$ to $1 \times 10^{-5}$ Pa), either through a desired mask pattern or via direct patterning, using an EUV or EB exposure apparatus or the like, and PEB (post exposure baking) is then conducted under temperature conditions of 80 to 150° C. for 40 to 120 seconds, and preferably for 60 to 90 seconds. Subsequently, a developing treatment is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

EXAMPLES

Composition of Resists

The composition of the resists used in the examples of the present invention, with the exception of the organic solvent, is as described below. Namely, the component (A), the component (B), and a nitrogen-containing organic compound were dissolved in each of the organic solvents (2000 parts by weight) shown below, thus yielding a series of positive resist compositions.

Component (A): 100 parts by weight of a copolymer (weight average molecular weight: 10,000) obtained by copolymerization of hydroxystyrene, styrene, and t-butyl methacrylate in a molar ratio of 65/15/20.

Component (B): 5.0 parts by weight of triphenylsulfonium nonafluorobutanesulfonate.

Other additives: 0.3 parts by weight of triethanolamine.

Example 1

MAK

Example 2

PGME

Example 3

MMP

Example 4

BuOAc

Comparative Example 1

PGMEA

Comparative Example 2

EL

Comparative Example 3

3-hexanone (Measurement of Variation in Film Thickness)

Each of the above resist compositions was applied to the surface of a silicon substrate of diameter 200 mm in sufficient quantity to generate a film thickness of 2300±10% Å, and the film thickness was then measured after heating for 90 seconds at temperature conditions of 90° C., 110° C., 130° C., and 150° C. respectively.

The values measured at 130° C. and 150° C. were used to determine the value of the left-hand member of the above formula (I).

The results are shown in Table 1 and in the graph of FIG. 1.

(Degree of Variation in Total Pressure)

Each of the above resist compositions was applied to the surface of a silicon substrate of diameter 200 mm in sufficient quantity to generate a film thickness of 2300±10% Å, and the film was then heated for 90 seconds under temperature conditions of 130° C.

Subsequently, under conditions including a pressure of $1 \times 10^{-7}$ to $1 \times 10^{-5}$ Pa, and a temperature of room temperature (25° C.), the NewSubaru radiation optical facility at the Himeji Institute of Technology was used to conduct a selective exposure (exposure time: 60 seconds) of the resist film, using light of 13.5 nm, a heat accumulation current value for the ring of 200 mA, and a resist film thickness of 100 nm.

During this exposure, the degree of variation in the total pressure within the chamber inside which the substrate was positioned within the apparatus, was measured between the state prior to exposure and the state following exposure. The results are shown in Table 1.

TABLE 1

| | Organic solvent | Film thickness (Å) | | | | Value of left-hand member of formula (I) (Å/° C.) | Degree of variation in total pressure (Pa) |
|---|---|---|---|---|---|---|---|
| | | 90° C. | 110° C. | 130° C. | 150° C. | | |
| Example 1 | MAK | 1952 | 1937 | 1916 | 1914 | 0.1 | $3.10 \times 10^{-5}$ |
| Example 2 | PGME | 2606 | 2542 | 2534 | 2533 | 0.05 | $3.29 \times 10^{-5}$ |
| Example 3 | MMP | 2245 | 2224 | 2218 | 2215 | 0.15 | $3.50 \times 10^{-5}$ |
| Example 4 | BuOAc | 2296 | 2296 | 2295 | 2292 | 0.15 | $3.50 \times 10^{-5}$ |
| Comparative example 1 | PGMEA | 2240 | 2215 | 2174 | 2155 | 0.95 | $4.10 \times 10^{-5}$ |
| Comparative example 2 | EL | 2278 | 2256 | 2229 | 2224 | 0.25 | $4.00 \times 10^{-5}$ |
| Comparative example 3 | 3-hexanone | 2133 | 2080 | 2035 | 2020 | 0.75 | $4.20 \times 10^{-5}$ |

In the comparative examples, the reflectance from the mirror deteriorated 1 to 5% after approximately 1 hour of exposure, whereas in the examples, that type of reflectance deterioration was not observed. Furthermore, from the results shown in Table 1 and FIG. 1 it is evident that the examples 1 through 4 satisfy both the first condition and the second condition. The comparative examples 1 through 3 do not satisfy the first and second conditions.

Under the same conditions as those used for the measurement of the total pressure, the atmosphere was sampled prior to exposure and then following exposure, and when the fragment mass was measured, it was found that the pressure for low molecular weight compounds with a molecular weight within a range thought to correspond with decomposition products from the organic solvent (namely, 50 to 60) was significantly lower for the examples than for the comparative examples. Accordingly, in the examples 1 through 4 which satisfy the second condition, compounds are not released into the atmosphere, meaning the danger of contamination of the lens or mask or the like is consequently lower.

While preferred examples of the present invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition for an electron beam or EUV, comprising a compound (A) having acid dissociable, dissolution inhibiting groups, an acid generator (B), and an organic solvent comprising one or more compounds selected from the group consisting of propylene glycol monomethyl ether (PGME), methyl amyl ketone (MAK), butyl acetate (BuOAc), and 3-methyl methoxy propionate (MMP), wherein the compound (A) consists of a low molecular weight compound (A-2) having a molecular weight of no more than 2,000 and containing a plurality of phenol structures, in which a portion of the hydrogen atoms of hydroxyl groups within the low molecular weight compound have been substituted with an acid dissociable, dissolution inhibiting group, wherein the low molecular weight compound, before the hydroxyl groups have been substituted with the acid dissociable, dissolution inhibiting groups, is one or more selected from the group consisting of bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3', 4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols.

2. A resist composition for an electron beam or EUV according to claim 1, further comprising a nitrogen-containing compound (C).

3. A resist composition for an electron beam or EUV according to claim 1, wherein the proportion within the organic solvent of the compounds selected from the group consisting of propylene glycol monomethyl ether (PGME), methyl amyl ketone (MAK), butyl acetate (BuOAc), and 3-methyl methoxy propionate (MMP) are at least 70% by weight.

4. A resist composition for an electron beam or EUV according to claim 1, wherein the proportion within the organic solvent of the compounds selected from the group consisting of propylene glycol monomethyl ether (PGME), methyl amyl ketone (MAK), butyl acetate (BuOAc), and 3-methyl methoxy propionate (MMP) are at least 90% by weight.

5. A method of forming a resist pattern, comprising:
applying a resist composition for an electron beam or EUV according to any one of claims 1 and 2 to 4 to a substrate;
prebaking said substrate;
selectively exposing or directly patterning said substrate with an electron beam or EUV in a vacuum;
post exposure baking said substrate; and
conducting alkali developing to form said resist pattern.

6. A method of forming a resist pattern according to claim 5, wherein said composition satisfies formula (I) shown below:

$$[\text{Film thickness (1)}-\text{Film thickness (2)}]/(150-130) (\text{Å}/^\circ\text{C.}) \leq 0.2 (\text{Å}/^\circ\text{C.}) \quad (I)$$

wherein, said film thickness (1) is a film thickness following application of said resist composition to a substrate in sufficient quantity to generate a film thickness of 2300 Å±10% and subsequent heating at 130° C. for 90 seconds, and said film thickness (2) is a film thickness following application of said resist composition to a substrate in sufficient quantity to generate a film thickness of 2300 Å±10% and subsequent heating at 150° C. for 90 seconds.

7. The method of forming a resist pattern according to claim 5, wherein a degree of variation in total pressure of atmosphere inside an exposure system between a state prior to exposure and a state following exposure is less than $4.0\times10^{-5}$ Pa.

* * * * *

UNITED STATES PATENT AND TRADEMARK OFFICE
CERTIFICATE OF CORRECTION

PATENT NO.        : 7,879,528 B2
APPLICATION NO.   : 12/044678
DATED             : February 1, 2011
INVENTOR(S)       : Takeo Watanabe, Hideo Hada and Hiroo Kinoshita It is certified that error appears in the above-identified patent and that said Letters Patent is hereby corrected as shown below:

Column 1, Line 16, Before "incorporated" change "is" to --are--.

Column 2, Line 25, Change "containing" to --containing,--.

Column 7, Line 36, Change ""(meth)" to --(meth)--.

Column 8, Line 30, After "atoms)]" insert --.--.

Column 8, Line 56, After "atoms)]" insert --.--.

Column 9, Line 21, After "group)" insert --.--.

Column 9, Line 67, After "3)" insert --.--.

Column 11, Line 27, Change "preferred." to --preferred:--.

Column 11, Line 52 (approx.) Change "(a11):structural" to --(a11): structural--.

Column 12, Line 2, Change "(a12) structural" to --(a12): structural--.

Column 12, Line 21, Change "(a13) structural" to --(a13): structural--.

Column 13, Line 41, Change "(a11):structural" to --(a11): structural--.

Column 14, Line 42, After "(a11'))" insert --.--.

Column 17, Line 18 (approx.) After "above)" insert --.--.

Column 18, Line 22, Change "mot %" to --mol %--.

Column 18, Line 59, Change "mold %" to --mol %--.

Column 19, Line 56, After "above)" insert --.--.

Column 21, Line 17, Change "(a 13)" to --(a13)--.

Column 22, Line 25, Change "nor" to --not--.

Column 22, Line 62, Change "α-(methylsulfolnyloxyimino)-" to --α-(methylsulfonyloxyimino)- --.

Signed and Sealed this
Ninth Day of August, 2011

David J. Kappos
*Director of the United States Patent and Trademark Office*